United States Patent
Weibezahn

(10) Patent No.: US 8,210,424 B2
(45) Date of Patent: Jul. 3, 2012

(54) SOLDERING ENTITIES TO A MONOLITHIC METALLIC SHEET

(75) Inventor: Karl S Weibezahn, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 128 days.

(21) Appl. No.: 12/883,750

(22) Filed: Sep. 16, 2010

(65) Prior Publication Data

US 2012/0067412 A1   Mar. 22, 2012

(51) Int. Cl.
B23K 31/00 (2006.01)
B23K 31/02 (2006.01)

(52) U.S. Cl. .................. 228/248.1; 228/180.21

(58) Field of Classification Search .. 228/179.1–180.22, 228/249, 248.1, 251; 438/613–618
See application file for complete search history.

(56) References Cited

U.S. PATENT DOCUMENTS

| | | | | |
|---|---|---|---|---|
| 5,129,573 | A * | 7/1992 | Duffey | 228/180.1 |
| 5,498,575 | A * | 3/1996 | Onishi et al. | 228/180.21 |
| 5,547,530 | A * | 8/1996 | Nakamura et al. | 156/89.15 |
| 5,551,626 | A * | 9/1996 | Hasegawa et al. | 228/179.1 |
| 6,051,093 | A * | 4/2000 | Tsukahara | 156/251 |
| 6,196,444 | B1 * | 3/2001 | Davis et al. | 228/180.22 |
| 6,664,127 | B2 * | 12/2003 | Oka et al. | 438/64 |
| 6,857,557 | B2 | 2/2005 | Hua | |
| 7,249,411 | B2 * | 7/2007 | Belopolsky | 29/832 |
| 7,278,564 | B2 * | 10/2007 | Saito | 228/248.1 |
| 7,393,770 | B2 | 7/2008 | Wood et al. | |
| 7,536,762 | B2 * | 5/2009 | Imai et al. | 29/25.35 |
| 7,604,153 | B2 * | 10/2009 | MacKay et al. | 228/248.1 |
| 7,966,721 | B2 * | 6/2011 | Wada et al. | 29/840 |
| 2003/0111518 | A1 * | 6/2003 | Dances | 228/215 |
| 2004/0214370 | A1 | 10/2004 | Quinones et al. | |
| 2009/0184419 | A1 | 7/2009 | Pendse | |
| 2009/0308430 | A1 | 12/2009 | Everett et al. | |

OTHER PUBLICATIONS

Gu, et al. A novel capillary-effect-based solder pump structure and its potential application for through-wafer interconnection. IOP Publishing. Journal of Micromechanics and Microengineering. J. Micromech. Microeng. 19 (2009) 074005 (7PP).

* cited by examiner

Primary Examiner — Kiley Stoner
Assistant Examiner — Carlos Gamino
(74) Attorney, Agent, or Firm — Scott Gallert

(57) ABSTRACT

Methods and apparatus are provided for solder bonding entities to solid materials. One or more through apertures are formed in a solid material. Solder paste is introduced into each through aperture. Respective entities having solderable surface features are disposed in overlying alignment with the through apertures. The arrangement is heated causing molten solder paste to wet the solderable surface features and the solid material. Cooling results in the electrical and mechanical bonding of the entities to the solid material. Devices having substantially planar form factors and without lead wires can be electrically and mechanically secured to a supporting conductive stratum.

12 Claims, 5 Drawing Sheets

SOLDERING ENTITIES TO A MONOLITHIC METALLIC SHEET

GOVERNMENTAL RIGHTS IN THE INVENTION

The invention that is the subject of this patent application was made with Government support under Subcontract No. CW135971, under Prime Contract No. HR0011-07-9-0005, through the Defense Advanced Research Projects Agency (DARPA). The Government has certain rights in this invention.

BACKGROUND

Securing electronic devices and other entities to conductive circuit pathways is well known. Typically, such a device includes a number of lead wires or similar protrusions that extend into respective through apertures in a circuit board, or which make overlying contact with corresponding electrical traces borne by a circuit board. Soldering is then performed to complete the electromechanical bonding of the device to the various electrical pathways.

However, some electronic devices lack extension wires, leads, or protrusions for use in the soldering process. Adding such leads for the sole purpose of solder bonding is costly and time consuming. The present teachings address the foregoing and other concerns.

BRIEF DESCRIPTION OF THE DRAWINGS

The present embodiments will now be described, by way of example, with reference to the accompanying drawings, in which.

DETAILED DESCRIPTION

Introduction

Figure 1A:
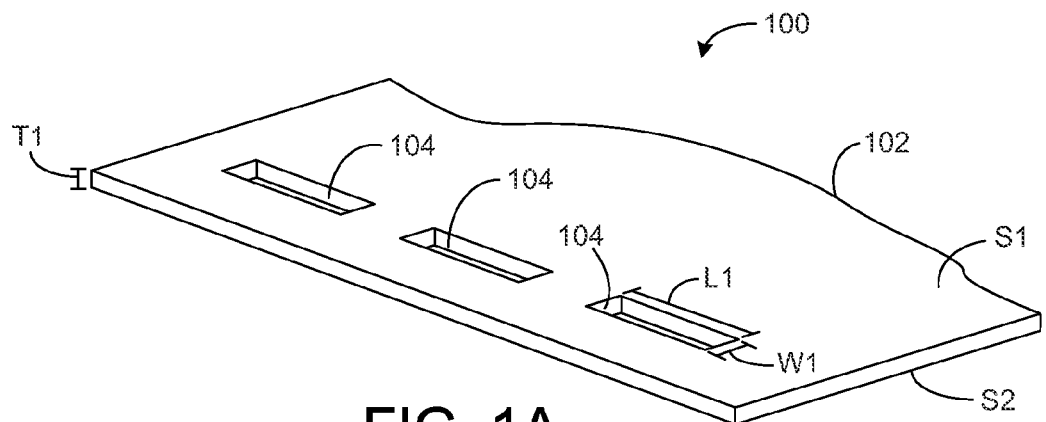
FIG. 1A is an isometric diagram of a portion of an apparatus according to one embodiment.

Methods and apparatus are provided for solder bonding entities to solid materials. One or more through apertures are cut or otherwise formed in a solid material. Solder paste is introduced into each aperture. Respective entities having solderable surface features are disposed in overlying alignment with the through apertures. The arrangement is heated causing molten solder paste to wet the solderable surface features and the solid material. Cooling results in the electrical and mechanical bonding of the entities to the solid material. Devices having substantially planar form factors and without lead wires can be electrically and mechanically secured to a supporting conductive stratum.

In one embodiment, a method includes forming an aperture through a solid material. The solid material is defined by a first side and a second side opposite the first side. The method also includes providing a solder paste within the aperture, and disposing an entity in overlapping relationship with the aperture and in contact with the first side of the solid material. The method also includes heating and then cooling the second side of the solid material so as to electromechanically bond the entity to the solid material by way of wicking at least a portion of the solder paste into contact with the entity.

In another embodiment, a method is performed for bonding an electronic entity to a conductive material. The method includes forming a through aperture in the conductive material. The method also includes disposing a quantity of solder paste within the through aperture. The method also includes bringing the electronic entity into contact with a first side of the conductive material. The electronic entity has a solderable surface feature that is aligned with the through aperture. The method further includes heating a second side of the conductive material so as to reflow the solder paste into wetting contact with both the first side of the conductive material and the solderable surface feature. The method also includes cooling the conductive sheet such that the electronic entity is electrically and mechanically bonded to the conductive material.

In still another embodiment, an apparatus includes an entity that is electromechanically bonded to a solid material by way of a solder. The entity is defined by a solderable surface feature that overlies a through aperture defined by the solid material. The solder is in bonded contact with the solderable surface feature and the solid material.

In another embodiment, an apparatus includes an electronic entity. The apparatus also includes a solderable solid material defining an aperture there through. The solderable solid material is defined by a first side. The electronic entity is bonded to the first side of the solderable solid material in an overlapping relationship with the aperture by way of solder. The solder is bonded to the entity and to the first side of the solderable solid material about the aperture. Additionally, the electronic entity has no feature that extends into the aperture.

First Illustrative Apparatus

Reference is now directed to FIG. 1A, which depicts an isometric view of a portion of an apparatus 100. The apparatus 100 is illustrative and non-limiting with respect to the present teachings. Thus, other apparatuses, devices or systems can be configured and/or operated in accordance with the present teachings.

The apparatus 100 includes a solid material (material) 102. The material 102 can be defined by any suitable, solder-bondable material such as, for non-limiting example, copper, silver, gold, brass, tin, or aluminum. In one example, the material 102 is defined by copper sheet metal having a uniform thickness "T1" of about zero-point-zero-zero-two inches (0.002 inches). Other materials, having other respective dimensions and form factors (e.g., plates, sheets, blocks, bulk shapes), can also be used. The solid material 102 is defined by a first side surface "S1" and a second, opposite side surface "S2".

The solid material 102 defines a plurality of through apertures 104. That is, a plurality of through apertures 104 has been formed in the material 102 by way of, without limitation, machine milling, machine punching, laser cutting, water-jet cutting, or other suitable means. Each through aperture 104 is defined by a rectangular plan form having a length dimension "L1" and a width dimension "W1".

The dimensions "L1" and "W1" of the through apertures 104 are selected so as to support a quantity of solder paste introduced therein by surface tension alone. In one example, each through aperture 104 is defined by a length "L1" of 0.2 millimeters, by a width "W1" of 0.05 millimeters, and by the thickness "T1" of 0.002 inches. Other dimensions corresponding to other examples can also be used. Further discussion regarding solder paste is provided below.

Figure 1B:
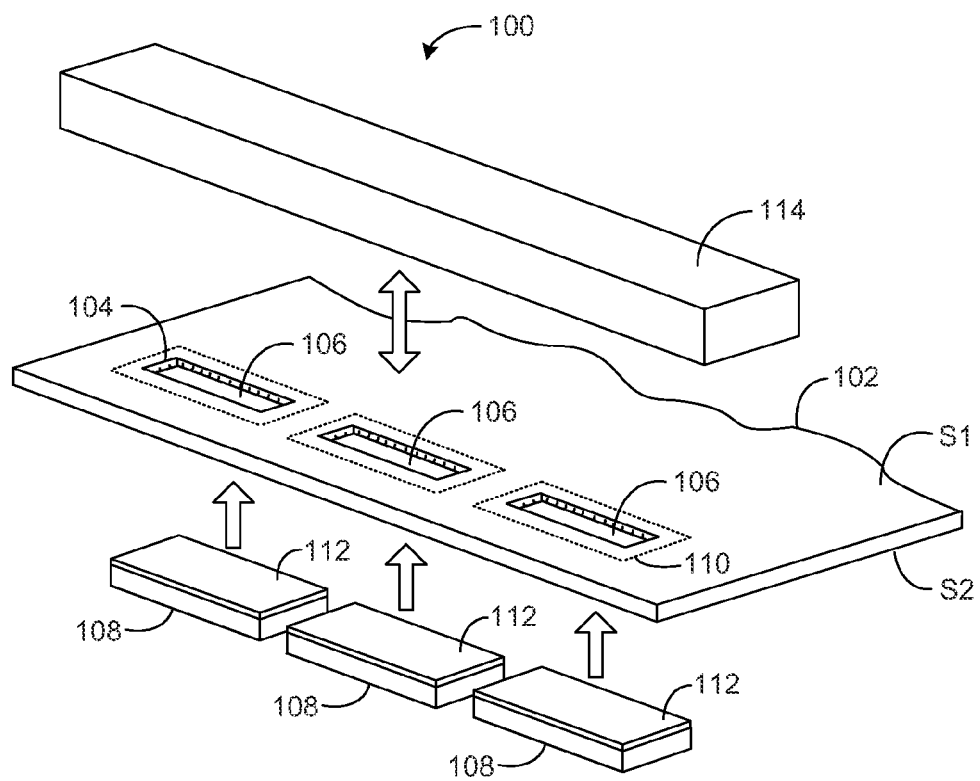
FIG. 1B is an isometric diagram of additional details of the apparatus of FIG. 1A.

Attention is now directed to FIG. 1B, which depicts an isometric view of further details of the apparatus 100. The depiction of FIG. 1B is illustrative and non-limiting with respect to the present teachings. Thus, other apparatuses, devices or systems can be configured and/or operated in accordance with the present teachings. The apparatus 100 is depicted in FIG. 1B in a dissembled state so that illustrative material components and assembly method aspects according to the present teachings can be understood.

A quantity of solder paste 106 has been introduced or placed into each of the through apertures 104. In one example, the solder paste 106 is defined by Bi58/Sn42 solder paste having a melting temperature of about one-hundred thirty-eight degrees Celsius, as available from Indium Corporation, Clinton, N.Y., U.S.A. Other suitable solder paste 106 can also be used. It is noted that the solder paste 106 is contained about (i.e., more or less) within the volumetric boundaries (i.e., "T1" by "L1" by "W1") of each through aperture 104.

Additionally, each quantity of solder paste 106 is supported—In essence, suspended in place despite the force of gravity—by way of surface tension. Thus, each quantity of solder paste 106 can be supported by contact with inner side walls of the associated through aperture 104 and does not require contact with another solid entity or surface.

The apparatus 100 also includes a plurality of entities 108. Each of the entities 108 can be defined by a suitable electronic device or other article. In one example, each of the entities 108 is defined by a photovoltaic (PV) cell. Other entities 108 can also be used such as, for non-limiting example, metallic parts, integrated circuits, power transistors, etc. Each of the entities 108 is defined by a footprint area 110 that is projected onto the side surface "S1" of the solid material 102.

Each of the entities 108 includes a solderable surface feature 112. Each solder surface feature 112 can be formed from any suitable solder-bondable material. In one example, each entity 108 includes a solderable surface feature 112 formed from copper sheet metal. Each solderable surface feature 112 is configured to electrically couple and mechanically bond the associated entity 108 to the solid material 102 by way of soldering. Such joinery is also referred to herein as electro-mechanical bonding.

Each solderable surface feature 112 is defined by a planar form factor and includes no lead wires or other protrusions extending away from the associated entity 108. Thus, each solderable surface feature 112 can be, for non-limiting example, cut from sheet metal and without the need to define surface features, extensions, indentations, etc. Other non-planar form factors can also be used with respect to solderable surface features according to the present teaching.

During normal assemblage of the apparatus 100, the solder paste 106 is provided into each of the through apertures 104 and is supported therein by way of surface tension, at least for a brief period of time (e.g., a few seconds, one minute, etc.). The entities 108 are then brought into contact with the side surface "S1" of the material 102. The solderable surface feature 112 of each entity 108 is positioned and held in contact with the solid material 102 coincident with a respective footprint area 110. Each entity 108 is thus aligned or registered with a respective through aperture 104 in an overlapping relationship. It is note that no portion of an entity 108 or the respective solderable surface feature 112 extends into the associated through aperture 104.

A source of heat, illustrated as an electrical heating element or "hotbar" 114, is then brought into contact with the side surface "S2" of the solid material 102. Hotbar 114 contact is generally made proximate to or aligned with the through apertures 104. The hotbar 114 is controlled so as to heat the material 102 and also heats the solder paste 106 into a molten state. In one example, the hotbar 114 is controlled in accordance with time-and-temperature profile information as provided by the vendor or source of the solder paste 106.

Capillary action causes the molten solder paste 106 to flow between the side surface "S1" of the solid material 102 and the respective solderable surface features 112 such that each is "wetted" by the solder. This solder paste 106 flow action is also referred to as "wicking" or "reflow". Each solder wetted-area includes the footprint area 110 and that portion of the solderable surface feature 112 that faces into the corresponding through aperture 104. The molten solder paste 106 tends not to migrate outside of the footprint area 110 and electrical shorting or other interference between proximate entities 108 is essentially avoided.

The hotbar 114 is then drawn away out of contact with the solid material 102 allowing the apparatus 100 to cool. The cooling solder paste 106 hardens in situ, forming an electro-mechanical bond between the respective entities 108 and the solid material 102. Each of the entities 108 is now fixed in electrically conductive contact with the material 102. For example, multiple PV cells can be electromechanically bonded to a supporting metallic substrate that also serves as a common electrical node. Large PV arrays can thus be constructed in relatively rapid fashion and at reduced cost over known techniques. Other apparatus can also be constructed in accordance with present teachings.

Second Illustrative Embodiment

Figure 2A:
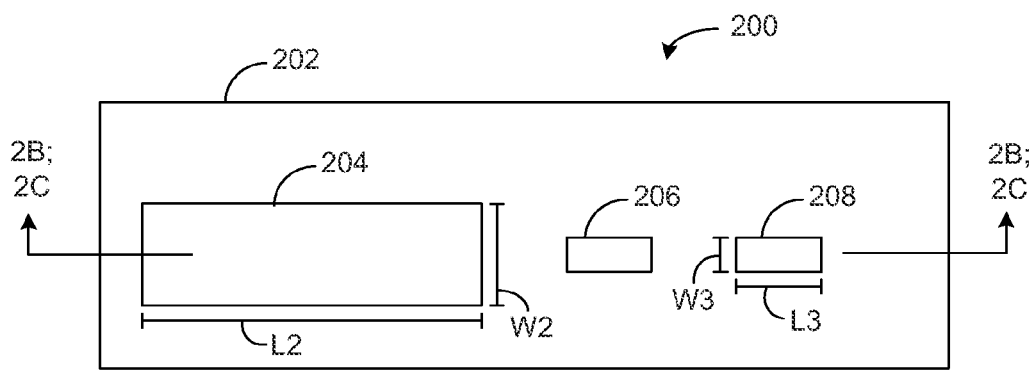
FIG. 2A is a plan view of a portion of an apparatus according to another embodiment.

Attention is directed to FIG. 2A, which depicts a plan view of a portion of an apparatus 200 according to the present teachings. The apparatus 200 is illustrative and non-limiting with respect to the present teachings. Thus, other apparatuses, devices or systems can be configured and/or operated in accordance with the present teachings.

The apparatus 200 includes a solid material 202. The solid material 202 can be defined by any suitable, solder-bondable material such as, for non-limiting example, copper, brass, tin, or aluminum. In one example, the material 202 is defined by copper sheet metal. Other materials having various thicknesses and side surface dimensions can also be used.

The solid material 202 defines a through aperture 204. That is, a through aperture 204 has been formed in the solid material 202 by machine punching, milling, laser cutting, water-jet cutting, etc. The through aperture 204 is defined by a length dimension "L2" and a width dimension "W2". The length "L2" and width "W2" dimensions of the aperture 204 are too great to support solder paste therein by surface tension alone, and additional support is provided as described below. In one example, the length "L2" is eight millimeters, and the width "W2" is one millimeter.

The solid material 202 further defines a through aperture 206 and a through aperture 208, respectively. The through apertures 206 and 208 can be formed by, without limitation, machine punching, laser cutting, water-jet cutting, or other suitable means. Each of the through apertures 206 and 208 is defined by a length dimension "L3" and a width dimension "W3".

Figure 2B:
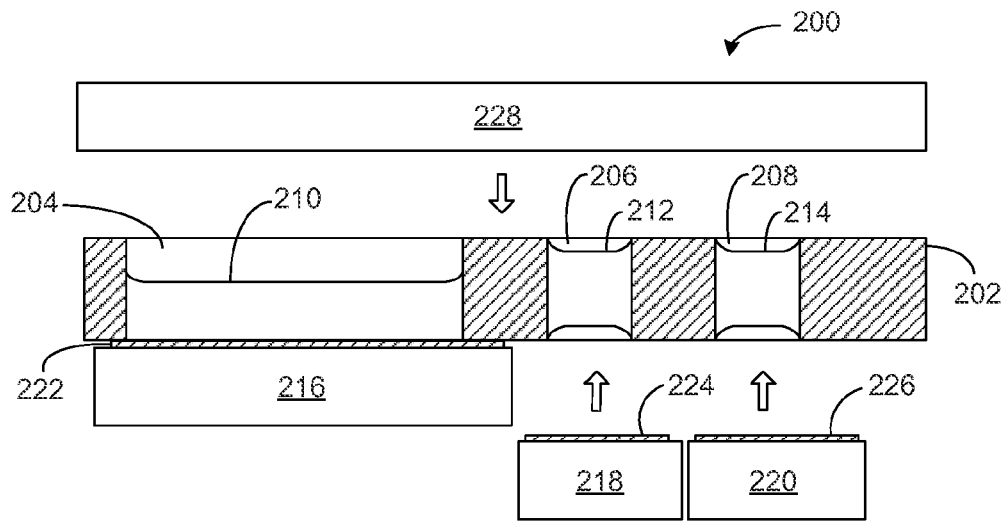
FIG. 2B is an elevation section view of additional details of the apparatus of FIG. 2A.

Attention is turned to FIG. 2B, which depicts an elevation sectional view of further details of the apparatus 200. The depiction of FIG. 2B is illustrative and non-limiting with respect to the present teachings. Thus, other apparatuses, devices or systems can be configured and/or operated in accordance with the present teachings. The apparatus 200 is depicted in FIG. 2B in a dissembled state so that illustrative material components and assembly method aspects according to the present teachings can be understood.

The apparatus 200 also includes a quantity of solder paste 210 provided (i.e., placed, or deposited) into the through aperture 204. The solder paste 210 can be defined by Bi58/Sn42 solder paste having a melting temperature of about one-hundred thirty-eight degrees Celsius. Other suitable solder pastes can also be used. The solder paste 210 is supported in place by way of contact with an entity 216, which is described in further detail below. The apparatus 200 also includes quantities of solder paste 212 and 214, disposed within through apertures 206 and 208, respectively. The quantities of solder paste 212 and 214 are supported by surface tension alone at least for a brief time period prior to complete assembly as described below.

The apparatus 200 also includes an entity 216, an entity 218 and an entity 220. For purposes of example, each of the entities 216, 218 and 220 is defined by a photovoltaic (PV) cell. Other electronic devices, integrated circuits, etc., can also be used. Each of the entities 216, 218 and 220 includes a solderable surface feature 222, 224 and 226, respectively. Each of the solderable surface features 222-226 can be formed from metal such as, for non-limiting example, copper, brass, etc. Other materials can also be used. It is noted that the illustrative solderable surface features 222, 224 and 226, respectively, are planar in form and do not include any lead-wires or other similar protrusions that extend away from the respective entities 216, 218 and 220. Other form factors for solderable surface features can also be used.

The apparatus 200 is assembled generally as follows: the entity 216 is brought into contact with the solid material 202 and aligned with the through aperture 204. Specifically, the entity 216 is positioned such that the solderable surface feature 222 is in contact with the solid material 202 and overlaps the periphery surrounding the through aperture 204. The quantity of solder paste 210 is then provided into the through aperture 204, supported therein by way of contact with the solderable surface feature 222. The quantities of solder paste 212 and 214 are also provided into the through apertures 206 and 208, respectively, and are supported therein by way of surface tension alone.

The entities 218 and 220 are then positioned such that the solderable surface features 224 and 226, respectively, are in contact with the material 202, aligned with and overlapping the through apertures 206 and 208, respectively. A hotbar 228 is then brought into contact with the solid material 202 on a side opposite to the entities 216-220. The hotbar 228 heats the solid material 202 and the solderable surface features 216-220. The hotbar 228 also heats the quantities of solder paste 210, 212 and 214 into a molten state. The molten quantities of solder paste 210, 212 and 214 are then drawn by capillary action (i.e., a form of surface tension) into "wetting" contact with the solderable surface features 222, 224 and 226 and the peripheries about the through apertures 204, 206 and 208.

Figure 2C:
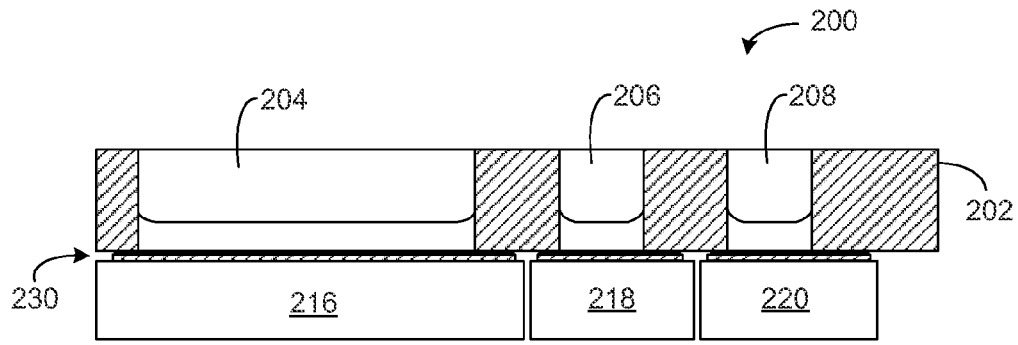
FIG. 2C is an elevation section view of the apparatus of FIG. 2A in an assembled state.

The hotbar 228 is then drawn away from the material 202, allowing the apparatus 200 to cool. The quantities of solder paste 210, 212 and 214 create electrically conductive and mechanically secure bonds between the entities 216, 218 and 220 and the solid material 202 as they cool, defining a solder bonding layer or region 230. Thus, the entities 216, 218 and 220 are electromechanically bonded to the solid material 202. The material 202 now serves as both a supportive stratum and as a common electrical node for the respective PV cells (entities) 216, 218 and 220. Assembly of the apparatus 200, as is germane to the present teachings, is now complete. The assembled state of the apparatus 200 is depicted in FIG. 2C.

First Illustrative Method

Figure 3:
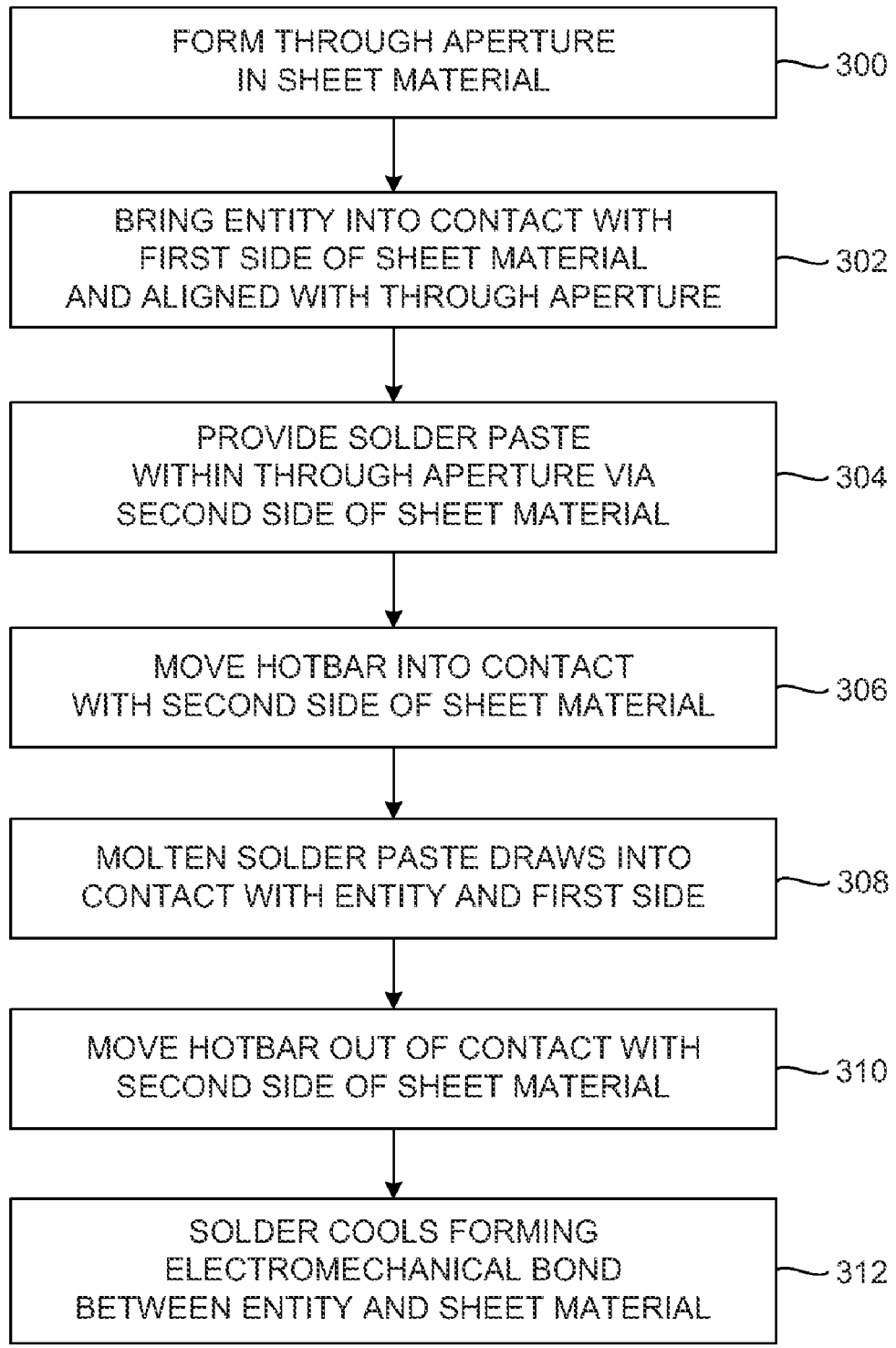
FIG. 3 is a flow diagram depicting a method according to one embodiment.

Attention is now directed to FIG. 3, which depicts a flow diagram of a method according to another embodiment according to the present teachings. The method of FIG. 3 includes particular operations and order of execution. However, other methods including other operations, omitting one or more of the depicted operations, and/or proceeding in other orders of execution can also be used according to the present teachings. Thus, the method of FIG. 3 is illustrative and non-limiting in nature. Reference is also made to FIGS. 2A-2C in the interest of understanding the method of FIG. 3.

At 300, a through aperture is formed in a solid material. For purposes of illustration, it is assumed that a sheet of copper metal 202 is cut by laser so as to define a through aperture 204.

At 302, an entity is brought into contact with a first side of the solid material, the entity being aligned with the through aperture. For purposes of the present illustration, an entity 216 having a solderable surface feature 222 is brought into contact with the sheet of copper metal 202. The entity 216 is positioned in overlapping alignment with the through aperture 204. The entity 216 can be defined by a PV cell, power transistor, power rectifying diode, or other suitable device.

At 304, a quantity of solder paste is provided into the through aperture via a second side of the solid material. For purposes of the present illustration, a quantity of solder paste 210 is provided into the through aperture 204 from a side opposite the entity 216. The solder paste 210 is supported in place at least in part by way of contact with the solderable surface feature 222.

At 306, a hotbar is moved into contact with the second side of the solid material. For purposes of the present illustration, a hotbar 228 is moved into contact with the sheet of copper metal 202 on a side opposite the entity 216. The hotbar 228 heats the sheet of copper metal 202 and the solderable surface feature 222, and causes the quantity of solder paste 210 to heat into a molten state.

At 308, the molten solder paste is drawn into contact with the entity and the first side of the solid material. For purposes of the present illustration, the quantity of solder paste 210—now in a molten state—is drawn by capillary action in between the solderable surface feature 222 and the adjacent side surface of the sheet of copper metal 202. In this way, the molten solder paste 210 operates to "wet" both the solderable surface feature 222 and the underlying portion (i.e., the footprint area) of the sheet of copper metal 202.

At 310, the hotbar is moved away out of contact with the second side of the solid material. For purposes of the present illustration, the hotbar 228 is moved away from the sheet of copper metal 202. The copper metal 202, the molten solder paste 210 and the entity 216 now begin to cool.

At 312, the solder paste cools and forms an electromechanical bond between the entity and the solid material. For purposes of the present illustration, the quantity of solder paste 210 cools and solidifies in place. The entity 216, by virtue of the solderable surface feature 222, is electrically and mechanically joined or bonded to the sheet of copper metal 202. As such, the copper metal 202 functions as both a supportive stratum and as an electrical node for the entity 216.

Second Illustrative Method

Figure 4:
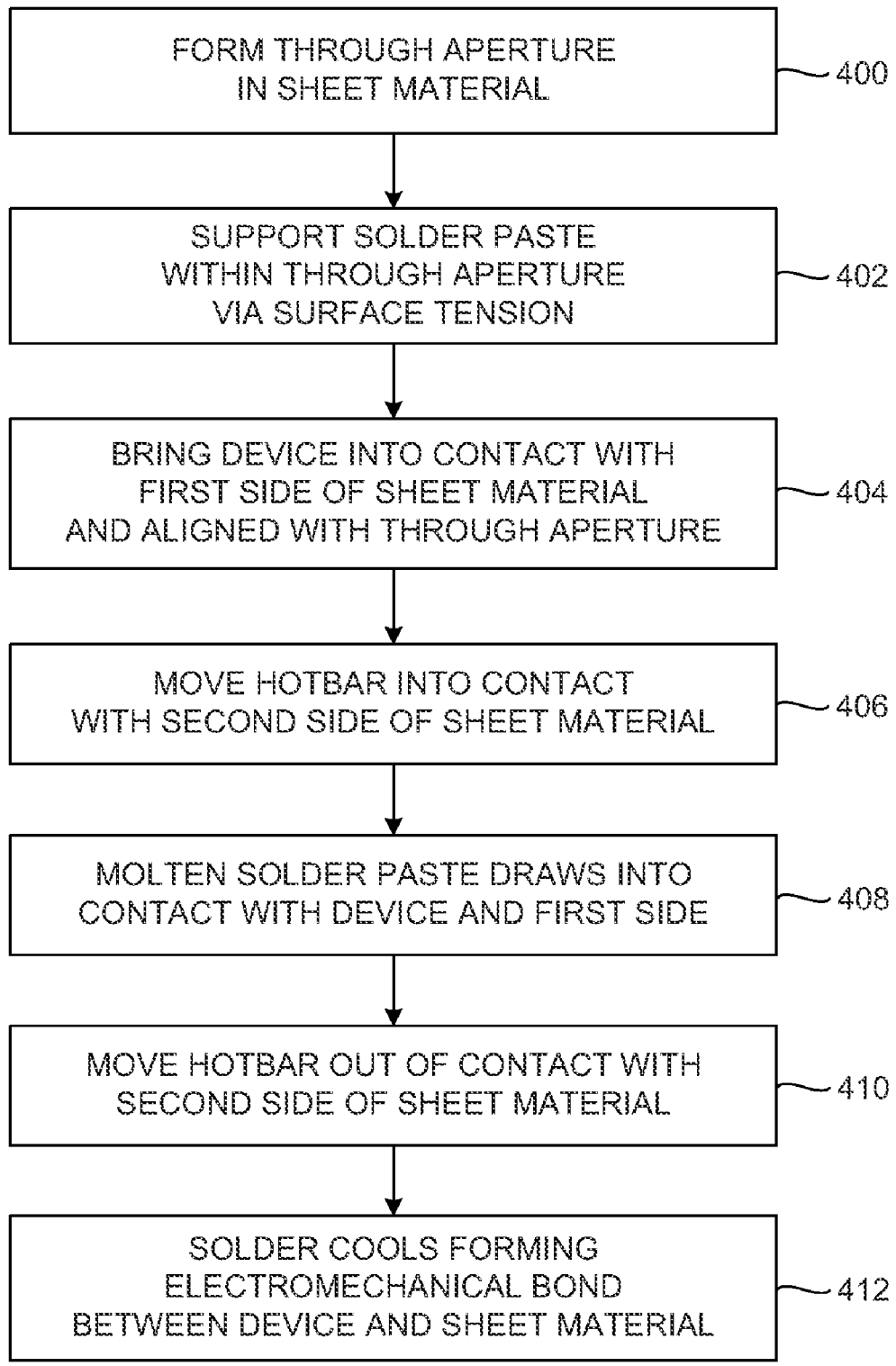
FIG. 4 is a flow diagram depicting a method according to another embodiment.

Attention is now directed to FIG. 4, which depicts a flow diagram of a method according to another embodiment according to the present teachings. The method of FIG. 4 includes particular operations and order of execution. However, other methods including other operations, omitting one or more of the depicted operations, and/or proceeding in other orders of execution can also be used according to the present teachings. Thus, the method of FIG. 4 is illustrative and non-limiting in nature. Reference is also made to FIGS. 2A-2C in the interest of understanding the method of FIG. 4.

At 400, a through aperture is formed in a solid material. For purposes of illustration, it is assumed that a sheet of copper metal 202 is cut by laser so as to define a through aperture 206.

At 402, a quantity of solder paste is provided into the through aperture of the solid material. For purposes of the present illustration, a quantity of solder paste 212 is provided into the through aperture 206. The solder paste 210 is supported in place by way of surface tension alone.

At 404, an entity is brought into contact with a first side of the solid material, the entity being aligned with the through aperture. For purposes of the present illustration, an entity 218 having a solderable surface feature 224 is brought into contact with the sheet of copper metal 202. The entity 218 is positioned in overlapping alignment with the through aperture 206. The entity 218 can be defined by a PV cell, power transistor, power rectifying diode, or other suitable device.

At 406, a hotbar is moved into contact with the second side of the solid material. For purposes of the present illustration, a hotbar 228 is moved into contact with the sheet of copper metal 202 on a side opposite the entity 218. The hotbar 228 heats the sheet of copper metal 202 and the solderable surface feature 224, as well as heating the quantity of solder paste 212 into a molten state.

At 408, the molten solder paste is drawn into contact with the entity and the first side of the solid material. For purposes of the present illustration, the molten quantity of solder paste 212 is drawn by capillary action in between the solderable surface feature 224 and the adjacent side surface of the sheet of copper metal 202. In this way, the molten solder paste 212 operates to "wet" both the solderable surface feature 224 and the corresponding footprint area of the sheet of copper metal 202.

At 410, the hotbar is moved away out of contact with the second side of the solid material. For purposes of the present illustration, the hotbar 228 is moved away from the sheet of copper metal 202. The copper metal 202, the molten solder paste 212 and the entity 218 now begin to cool.

At 412, the solder paste cools forming an electromechanical bond between the entity and the solid material. For purposes of the present illustration, the quantity of solder paste 212 cools and solidifies in place. The entity 218, by virtue of the solderable surface feature 224, is electrically and mechanically joined or bonded to the sheet of copper metal 202. As such, the sheet of copper metal 202 functions as both a supportive stratum and as an electrical node for the entity 218.

Third Illustrative Embodiment

Figure 5A:
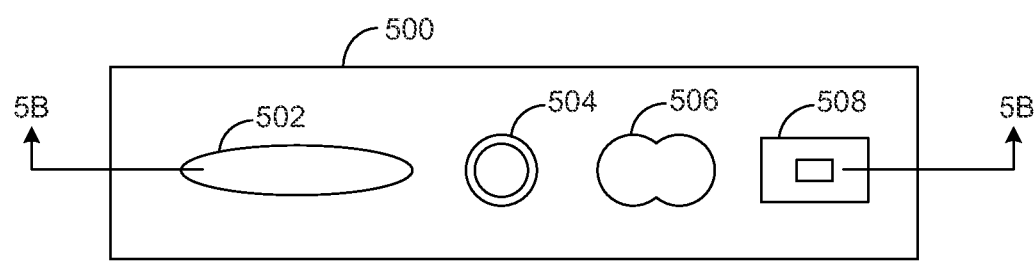
FIG. 5A is a plan view of a solid material having through apertures according to one embodiment.
Figure 5B:
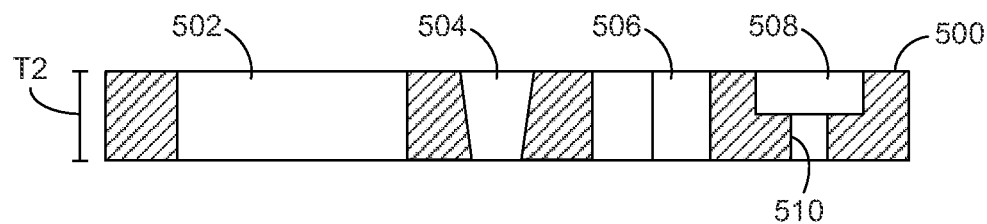
FIG. 5B is an elevation section view of the solid material of FIG. 5A.

FIG. 5A is a plan view depicting a portion of a solid material 500 in accordance with another illustration of the present teachings, while FIG. 5B is a section elevation view corresponding to FIG. 5A. The solid material 500 can be defined by any solderable material such as copper, gold, silver, brass, and so on. The solid material 500 is configured to define respective through apertures 502, 504, 506 and 508. The through aperture 502 is defined by a continuous oval cross-sectional area through the thickness "T2" of the material 500. The through aperture 502 is suitable for receiving solder paste (e.g., 106) for entity (e.g., 108) bonding according to the present teachings The through aperture 504 defined by a changing circular cross-sectional area through the thickness "T2" such that a truncated cone is defined. The through aperture 504 is configured to provide additional support to a solder paste provided therein by virtue of its tapered form. In turn, the through aperture 506 is of continuous "figure eight" cross-sectional area through the thickness "T2" of the material 500. The through aperture 506 illustrates yet another of an unlimited number of such apertures contemplated by the present teachings.

The through aperture 508 is rectangular and defined by a step-change in cross-sectional area through the thickness "T2" of the solid material 500. The through aperture 508 is thus defined by an internal step feature 510. The through aperture 508 provides additional support to a solder paste (e.g., 106) deposited therein by virtue of its step-wise cross-sectional shape. One having ordinary skill can appreciate that the present teachings contemplate an essentially unlimited number of through apertures that can be defined in used for solder bonding various entities to a solid material. Such through apertures can vary respectively in cross-sectional shape, being further defined by constant or varying cross-sectional areas.

The foregoing methods and apparatus are illustrative of any number of embodiments contemplated by the present teachings. In general, and without limitation, a metallic or other solder-bondable solid material is laser cut, machined or otherwise processed so as to define one or more through apertures. Copper sheet metal, having a thickness of about 0.002 inches, is only one of numerous suitable examples of such a material according to the present teachings. The solder-bondable material then defines a supportive and electrically conductive stratum ready to have various entities bonded thereto.

The through apertures can respectively vary in volumetric dimensions and profiles such that, in some cases, a solder paste can be supported within a through aperture via surface tension alone. In other cases, mechanical support is provided to a solder paste by way of contact with an entity to be bonded to the sheet material. A quantity of solder paste is provided into each of the through apertures and is supported in place by way of surface tension or by contact with an entity.

One or more entities are placed in contact with the solder-bondable sheet material, aligned with and overlapping peripheral areas of respective ones of the through apertures. Each of the entities can be defined by various electronic devices or metallic components such as, without limitation, photovoltaic cells, power semiconductors, integrated circuits, etc. Each entity includes a solderable surface feature or features that is/are in contact with the solder-bondable solid material. It is noted that the entities do not require any sort of extensions, lead-wires or other protrusions in order to be soldered to the solder-bondable material, and as such do not require penetration into any portion of the associated through aperture or apertures.

A hotbar is then used to heat the solder-bondable solid material and to cause the solder paste to assume a molten state. Hot air jets, lasers, infrared lamps, induction heaters and other devices can also be used instead of or in addition to the hotbar. The respective quantities of molten solder paste are then drawn by capillary action into wetting contact with the solder-bondable solid material and the respective entities-adjacent thereto. Such heating is typically performed in accordance with time-and-temperature profile information provided by a vendor of the particular solder paste being used.

The hotbar (or other suitable source of heat) is then drawn away from the solder-bondable material allowing the arrangement to cool. The cooling quantities of solder paste solidify so as to form electrically-conductive, mechanically-fixed bonds between the solder-bondable sheet material and the respective entities. It is further noted that bonding operations according to the present teachings use minimized quantities of solder paste and avoid unwanted or detrimental molten solder migration over known techniques.

The present teachings contemplate the use of solders that include various metals having relatively low melting temperatures. However, the present teachings further contemplate that electrically conductive adhesives or other materials may exist or may be developed in the future having at least some solder-like characteristics. That is, such materials could be made to reflow at some greater temperature and then solidify (or substantially so) at some lesser temperature resulting in an electrically conductive and mechanically fixed bond. As used herein, the terms "solder", "solder paste" and their respective analogues are intended to include other existing or future materials suitable for use according to the present teachings.

In general, the foregoing description is intended to be illustrative and not restrictive. Many embodiments and applications other than the examples provided would be apparent to those of ordinary skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. A method, comprising:
   forming an aperture through a solid material, the solid material defined by a first side and a second side opposite the first side, the solid material being a monolithic metallic sheet;
   providing a solder paste within the aperture;
   disposing an entity in overlapping relationship with the aperture and in contact with the first side of the solid material; and
   heating and then cooling the second side of the solid material so as to electromechanically bond the entity to the solid material by way of wicking at least a portion of the solder paste into contact with the entity.

2. The method according to claim 1, the providing the solder paste including supporting the solder paste within the aperture by way of surface tension alone for a period of time.

3. The method according to claim 1, the providing the solder paste including supporting the solder paste within the aperture by way of supportive contact with the entity.

4. The method according to claim 1, the entity being defined by an electronic device having a solderable surface feature, the solderable surface feature configured to remain external to the aperture during a life of the bond.

5. The method according to claim 1, the solid material including at least copper, silver, gold, brass, tin or aluminum.

6. The method according to claim 1, the heating performed by way of bringing a heated bar into temporary contact with the second side of the solid material.

7. The method according to claim 1 further comprising:
   forming plural apertures through the solid material;
   providing the solder paste within each of the plural apertures;
   disposing plural entities in overlapping relationship with respective ones of plural apertures and in contact with the first side of the solid material; and
   heating and then cooling the second side of the solid material so as to contemporaneously electromechanically bond the plural entities to the first side of the solid material by way of wicking the respective quantities of solder paste into contact with the respective entities.

8. The method according to claim 1, the providing the solder paste performed such that none of the solder paste extends outside of the aperture prior to the heating and then cooling.

9. A method of bonding an electronic entity to a conductive material, comprising:
   forming a through aperture in the conductive material, the conductive material being a monolithic metallic sheet;
   disposing a quantity of solder paste within the through aperture;
   bringing the electronic entity into contact with a first side of the conductive material, the electronic entity having a solderable surface feature aligned with the through aperture;
   heating a second side of the conductive material so as to reflow the solder paste into wetting contact with both the first side of the conductive material and the solderable surface feature; and
   cooling the conductive sheet such that the electronic entity is electrically and mechanically bonded to the conductive material.

10. The method according to claim 9, the disposing including supporting the quantity of solder paste within the through aperture by way of surface tension alone.

11. The method according to claim 10, the forming performed such that the through aperture is defined by an internal step feature.

12. The method according to claim 9, the solderable surface feature remaining completely external to the through aperture throughout a lifetime of the bond.

* * * * *

UNITED STATES PATENT AND TRADEMARK OFFICE
CERTIFICATE OF CORRECTION

| | | |
|---|---|---|
| PATENT NO. | : 8,210,424 B2 | Page 1 of 1 |
| APPLICATION NO. | : 12/883750 | |
| DATED | : July 3, 2012 | |
| INVENTOR(S) | : Karl S Weibezahn | |

It is certified that error appears in the above-identified patent and that said Letters Patent is hereby corrected as shown below:

In column 10, line 14, in Claim 7, after "ones of" insert -- the --.

Signed and Sealed this
Fifteenth Day of January, 2013

David J. Kappos
*Director of the United States Patent and Trademark Office*